(12) United States Patent
Boheas et al.

(10) Patent No.: US 10,445,434 B2
(45) Date of Patent: Oct. 15, 2019

(54) METHOD AND DEVICE FOR ESTIMATING A THICKNESS OF A CERAMIC THERMAL BARRIER COATING

(71) Applicant: SAFRAN AIRCRAFT ENGINES, Paris (FR)

(72) Inventors: Marie-Ange Boheas, Monthoiron (FR); Sarah Hamadi, Paris (FR); Andre Malie, Chatellerault (FR); Annie Pasquet, Longjumeau (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 941 days.

(21) Appl. No.: 14/368,127

(22) PCT Filed: Dec. 21, 2012

(86) PCT No.: PCT/FR2012/053049
§ 371 (c)(1),
(2) Date: Jun. 23, 2014

(87) PCT Pub. No.: WO2013/093370
PCT Pub. Date: Jun. 27, 2013

(65) Prior Publication Data
US 2015/0310133 A1 Oct. 29, 2015

(30) Foreign Application Priority Data
Dec. 23, 2011 (FR) ...................................... 11 62437

(51) Int. Cl.
*G06F 17/50* (2006.01)
*G06F 17/10* (2006.01)

(52) U.S. Cl.
CPC .............. *G06F 17/50* (2013.01); *G06F 17/10* (2013.01); *G06F 17/5018* (2013.01)

(58) Field of Classification Search
CPC ..................................................... G06F 17/50
USPC ............................................................ 703/1
See application file for complete search history.

(56) References Cited

U.S. PATENT DOCUMENTS

2004/0156724 A1* 8/2004 Torigoe ..................... C23C 4/18
416/241 R

OTHER PUBLICATIONS

Simon et al., "Mathematical Modeling of a Melt Pool Driven by an Electron Beam", Metallurgical and Materials Transactions B, vol. 30, Issue 3, Jun. 1999, pp. 515-525.*

(Continued)

*Primary Examiner* — Hugh M Jones
(74) *Attorney, Agent, or Firm* — Oblon, McClelland, Maier & Neustadt, L.L.P.

(57) ABSTRACT

An estimation method for estimating thickness of a ceramic thermal barrier coating that is to be deposited by physical vapor deposition from at least one target and onto a gas turbine hot part mounted on a support tooling, the method including: digitally modeling a geometrical shape of the hot part and its movements relative to the target; representing the modeled hot part as a surface mesh; and estimating, for at least one mesh element of the hot part exposed to the radiation from the target during deposition of the coating, a coating thickness to be deposited on the mesh element at a given instant by using a radiation model modeling radiation from the target and taking account of the position of the mesh element at that given instant relative to the target.

20 Claims, 4 Drawing Sheets

(56) References Cited

OTHER PUBLICATIONS

Pereira, "Computer model to predict electron beam-physical vapour deposition (EB-PVD) and thermal barrier coating (TBC) deposition on substrates with complex geometry", PhD Thesis, School of Industrial and Manufacturing Science, Cranfield University, http://dspace.lib.cranfield.ac.uk/handle/1826/5714, Jul. 2000, 255 pages.*
International Search Report dated May 29, 2013, in PCT/FR2012/053049, filed Dec. 21, 2012, 2 pp.
Indraneel Fuke, et al., "Computational Model for Predicting Coating Thickness in Electron Beam Physical Vapor Deposition", Journal of Manufacturing Processes, vol. 7, No. 2, XP 025410200, Jan. 2005, pp. 140-152.
James B. Oliver, et al., "Optimization of deposition uniformity for large-aperture National Ignition Facility substrates in a planetary rotation system", Applied Optics, vol. 45, No. 3, XP 001242699, May 1, 2006, pp. 3097-3105.

* cited by examiner

METHOD AND DEVICE FOR ESTIMATING A THICKNESS OF A CERAMIC THERMAL BARRIER COATING

BACKGROUND OF THE INVENTION

The invention belongs to the general field of depositing ceramic thermal barrier coatings on hot parts of gas turbines, such as turbojets, for example.

The invention relates more particularly to estimating a thickness of a ceramic thermal barrier coating that is to be deposited by physical vapor deposition on a hot part of a gas turbine, such as a stator guide vane or a rotor wheel blade of a high-pressure turbine.

The invention thus has a preferred, but nonlimiting, application to the field of aviation.

In known manner, while a gas turbine is in operation, its blades are subjected to relatively high temperatures.

In order to avoid the blades deterioration, one solution consists in coating the wall of a blade with a thermal barrier constituted by a ceramic outer layer in order to lower the temperature of the blade. A ceramic commonly used for this purpose is zirconia $ZrO_2$, possibly stabilized with yttrium. Such a ceramic thermal barrier is typically formed by physical vapor deposition (PVD), and more particularly by electron beam assisted PVD (EBPVD).

In the EBPVD technique, the wall of the blade is coated by ceramic vapor condensing thereon in a vacuum enclosure with a partial pressure of an inert or reagent gas. The ceramic vapor is generated by evaporating "target" bars of sintered ceramic that are bombarded by an electron beam.

Only the surface of the blade that is situated facing the surfaces of the ceramic bars is coated with a layer of ceramic by means of that method. Thus, in order to be able to cover the entire profile of the blade, the blade is placed in the vapor during EBPVD deposition on support tooling that is driven with movement in rotation or in oscillation relative to the "target" bars.

At present, the thickness of the ceramic thermal barrier coating that is to be deposited on the wall of the blade is specified by a design office. This specification takes account only of the maximum wall temperature that the blade can accept before deteriorating. However it does not take account of technical constraints associated with actually depositing the coating (e.g. the shape and the movements of the tooling and of the target bars, etc.), such that the coating thickness recommended by the design office cannot always be obtained in practice.

As a result, several tests are generally carried out on real parts in order to act in iterative manner to define support tooling for the blade and to define conditions for EBPVD deposition (e.g. movements of the tooling, exposure times of the hot part to the radiation from the target(s), etc.) making it possible to achieve a coating thickness that is as close as possible to the thickness specified by the design office.

Such tests require both the fabrication and the use of real parts such as blades and various pieces of blade support tooling and also of parts for masking zones of the blade that it is desired not to expose to the radiation from the ceramic bars during EBPVD deposition. Such tests also require the deposits made in this way to be analyzed, including cutting up blades after deposition, measuring deposits on various sections of the blade, and comparing the deposit thicknesses obtained with the specifications from the design office.

In general, at least three tests are needed to achieve the specifications of the design office. It can thus readily be understood that that constitutes a method that is relatively expensive, both in terms of material resources and in terms of the time needed for achieving a thermal barrier coating that is satisfactory compared with the specifications.

OBJECT AND SUMMARY OF THE INVENTION

The present invention serves in particular to remedy those drawbacks by proposing an estimation method for estimating the thickness of a ceramic thermal barrier coating that is to be deposited by physical vapor deposition from at least one target and onto a gas turbine hot part mounted on support tooling, the method comprising:
 a step of digitally modeling the geometrical shape of the hot part and its movements relative to said at least one target;
 a step of representing the hot part as modeled in this way as a surface mesh; and
 a step of estimating, for at least one mesh element of the hot part exposed to the radiation from the target during deposition of the coating, a coating thickness to be deposited on said mesh element at a given instant, by using a radiation model modeling radiation from the target and taking account of the position of said mesh element at that instant relative to the target.

Correspondingly, the invention also proposes a device for estimating the thickness of a ceramic thermal barrier coating that is to be deposited by physical vapor deposition from at least one target and onto a gas turbine hot part mounted on support tooling, the device comprising:
 means for digitally modeling the geometrical shape of the hot part and its movements relative to said at least one target;
 means for representing the hot part as modeled in this way as a surface mesh; and
 means for estimating, for at least one mesh element of the hot part exposed to the radiation from the target during deposition of the coating, a coating thickness to be deposited on said mesh element at a given instant, these means being suitable for using a radiation model modeling radiation from the target and for taking account of the position of said mesh element at that instant relative to the target.

Preferably, deposition is performed by electron beam assisted physical vapor deposition (EBPVD) that is performed in conventional manner with the help of ceramic targets such as bars or ingots of sintered ceramic.

The movements of the hot part relative to the target relate to the parameters and/or elements that characterize any movement of the hot part relative to the target during PVD deposition. Thus, the digital modeling of the movements of the hot part relative to the target may consist in particular in characterizing one or more axes of rotation of the hot part relative to the target, together with the associated speed(s) of rotation. It should be observed that the origin of the movement of a hot part relative to the target may be any origin, for example it may come from a movement of the support tooling, of the target, etc.

Thus, the invention proposes a predictive digital tool for quickly and easily dimensioning and characterizing the deposition of a thermal barrier on a hot part, while taking account of real industrial constraints (shapes and movements of a hot part relative to the target, masked portions of the hot part, etc.). Naturally, it is possible to develop a man machine interface (MMI) for this tool in order to facilitate use of the thicknesses obtained.

In accordance with the invention, the physical phenomena involved during thermal barrier deposition and associated in particular with bombarding the target with the electron beam and with generating molecules during evaporation of the target are treated as radiation from the target. Correspondingly, the portions of the hot part exposed to the vapor (i.e. to the ceramic particles) from the target are treated as portions exposed to radiation from the target.

The tool proposed by the invention thus relies advantageously on a radiation model modeling radiation from the target, with a ray emitted by the target in that model corresponding to a flux of ceramic particles emitted by the target along that ray. By analyzing the estimated thickness and by using digital models, the tool makes it easy to adapt the tooling and its movements for the purpose of achieving a deposit that is as close as possible to the specifications of the design office. This limits the amount of tests needed on real parts in order to achieve this result.

The surface meshing of the hot part makes it possible to calculate the thickness at different points on the part, and at different instants. This makes it possible to avoid the various operations of cutting up real parts that were previously used in order to verify results. Also, by means of the invention, it is possible to access the thickness of the deposit at numerous points on the hot part, thereby making it easier to analyze the results.

Furthermore, having recourse to a digital model of the hot part makes it possible to adapt to a wide variety of hot parts. By way of example, such digital modeling is made available by the CATIA® software developed by the supplier Dassault Systèmes and known in the field of computer assisted design (CAD).

In an implementation, the method of the invention further comprises:
  a step of digitally modeling the geometrical shape of said at least one target; and
  a step of representing said at least one target as modeled in this way as a surface mesh;
  wherein the radiation model is defined for a mesh element of said at least one target by:

$$I(\theta) = I_0 [\cos(\theta)]^n$$

where:
  $I(\theta)$ designates the intensity of a ray emitted by the mesh element of said at least one target in a direction at an angle $\theta$ relative to the normal to said mesh element (this intensity modeling the rate at which ceramic particles are emitted by the target in the direction $\theta$); and
  $n$ and $I_0$ designate predetermined constants.

The invention thus makes use of a model that is accurate and that also takes account of the shape of the target. It should be observed that the constants $n$ and $I_0$ may be determined theoretically or experimentally.

In another implementation, the method of the invention further comprises:
  a step of digitally modeling at least one mask suitable for preventing a zone of the hot part being exposed to the radiation from said at least one target; and
  a step of representing said at least one mask as a surface mesh;
  wherein the mesh elements of the hot parts that are taken into consideration during the estimation step comprise mesh elements that are not masked at the given instant from said at least one target by mesh elements of said at least one mask during deposition of the coating.

Modeling and representing masks as surface meshes give greater flexibility in taking deposition constraints into account. These masks may come from elements of the tooling itself used for supporting the hot part during PVD deposition (e.g. for a blade, the support tooling may mask the platform of the blade and its base), or may represent zones that it is desired not to expose to the evaporation (i.e. to the radiation) from the target during deposition (e.g. the trailing edge of the blade).

By means of the invention, it is thus also easy to test various positions for the hot part on the support tooling relative to the target by modeling appropriate masks.

In an implementation, the method of the invention further comprises:
  a step of digitally modeling the support tooling for supporting the hot part; and
  a step of representing the support tooling as modeled in this way as a surface mesh.

Modeling and surface meshing the tooling serve to improve the accuracy with which the thickness of the coating is estimated, and to make it easy to take account of changes in the support tooling for the hot part.

In addition, the use of a digital tool as proposed by the invention makes it easy to store support tooling (with the associated movements) that has been tested and verified relative to the specifications of the design office (in the sense that such tooling is known to make it possible to achieve the specifications of the design office). This produces better traceability of the intended verification tests. It is also easy to devise a tooling catalogue suitable for constituting a knowledge base for developing new tooling and new proposals for movements of the tooling.

It should be observed that the surface meshing of the support tooling as a surface mesh, given that the tooling participates only in defining the masks of the hot part, does not need to be as accurate as the surface mesh representation of the hot part and/or where appropriate, of the target.

In a variant implementation, during the estimation step, account may also be taken of a loss factor corresponding to rays that are emitted by said at least one target during deposition but that do not reach the hot part (in spite of there being no obstacle between the target and the hot part, some ceramic particles do not reach the hot part). Taking this loss factor into account makes it possible to obtain an estimate for the thickness of the coating that is closer to that defined experimentally during tests performed on real parts.

In an implementation, the various steps of the estimation method of the invention are determined by computer program instructions.

Consequently, the invention also provides a computer program on a data medium, the program being suitable for being performed in an estimation device, or more generally in a computer, the program including instructions adapted to performing steps of an estimation method as described above.

The program may use any programming language, and may be in the form of source code, object code, or code intermediate between source code and object code, such as in a partially compiled form, or in any other desirable form.

The invention also provides a computer readable data medium including instructions of a computer program as mentioned above.

The data medium may be any entity or device capable of storing the program. For example, the medium may comprise storage means, such as a read only memory (ROM), for example a compact disk (CD) ROM or a microelectronic circuit ROM, or indeed magnetic recording means, for example a floppy disk or a hard disk.

Furthermore, the data medium may be a transmissible medium such as an electrical or optical signal, which may be conveyed via an electrical or optical cable, by radio, or by other means. The program of the invention may in particular be downloaded from a network of the Internet type.

Alternatively, the data medium may be an integrated circuit in which the program is incorporated, the circuit being adapted to execute or to be used in the execution of the method in question.

In another aspect, the invention also provides the use of the method of the invention for estimating a thickness of a ceramic thermal barrier coating that is to be deposited by physical vapor deposition from at least one target and onto a stator blade or a rotor blade of a gas turbine.

BRIEF DESCRIPTION OF THE DRAWINGS

Other characteristics and advantages of the present invention appear from the following description made with reference to the accompanying drawings, which show an implementation having no limiting character. In the figures.

DETAILED DESCRIPTION OF THE INVENTION

The presently described implementation concerns estimating a thickness of a thermal barrier coating made of ceramic that is to be deposited by electron beam assisted physical vapor deposition (EBPVD) on a blade of a gas turbine.

By way of example, this blade is a stator guide vane or a rotor blade of a high-pressure turbine.

Nevertheless, this assumption is not limiting, and the invention can be applied to determining the thickness of a thermal barrier coating on other hot parts of a gas turbine.

As described above, in order to proceed with the EBPVD deposition of a ceramic thermal barrier on a gas turbine blade, the blade is placed in a vacuum enclosure with a partial pressure of inert or reagent gas. The blade is then coated by condensation of ceramic vapor generated by evaporating one or more ceramic sources by electron bombardment. By way of example, the ceramic sources may be sintered ceramic bars. In the meaning of the invention, these are "targets" (for the electron beam).

In order to expose the entire profile of the blade to the ceramic vapor emanating from the ceramic sources, the blade is placed in support tooling that causes it to move in rotation or in oscillation relative to the sources while EBPVD deposition is taking place.

Since the principle of the EBPVD deposition is known to the person skilled in the art, it is not described in greater detail herein.

Figure 1:
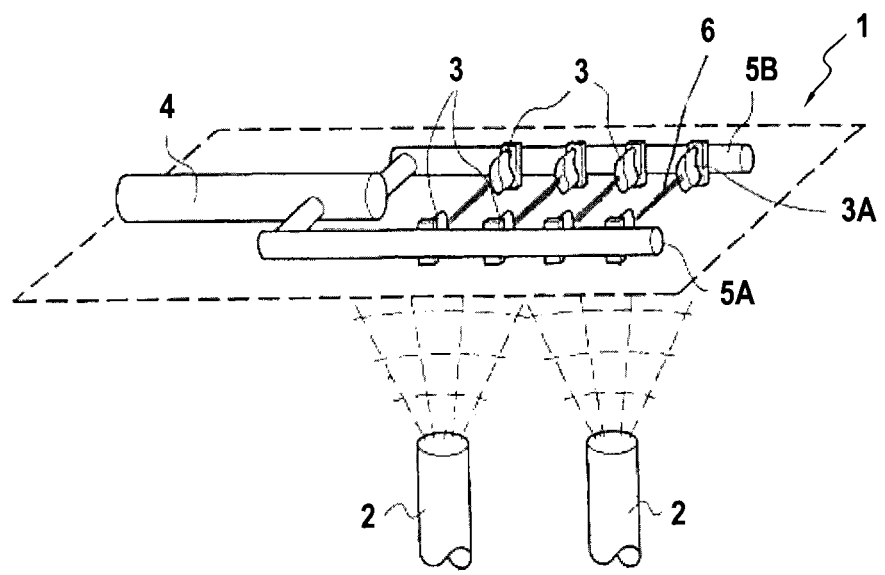
FIG. 1 shows, in its environment, support tooling having a plurality of gas turbine blades mounted thereon and suitable for use during EBPVD deposition.

By way of example, FIG. 1 shows, in its environment, support tooling 1 suitable for use during EBPVD deposition of a ceramic thermal barrier by one or more target sources 2 onto a plurality of high-pressure turbine blades 3.

This support tooling 1 has an arm 4 terminated by a fork having two parallel branches 5A and 5B. The parallel branches 5A and 5B support transverse cylindrical bars 6 on which the blades 3 are mounted.

The transverse bars 6 are caused to move in rotation about their axes of revolution, thereby causing the blades 3 to move relative to the targets 2.

The targets 2 are positioned under the support tooling 1 and clouds of ceramic vapor emanate therefrom under the effect of electron bombardment (not shown). The use of a plurality of targets 2 presents the advantage of providing a vapor field that is more uniform in the vicinity of the blades.

Each blade 3 is mounted on a transverse bar 6 and is fastened thereto via its trailing edge, its platform, and its root. It can thus immediately be understood that these zones of the blade are masked by elements of the tooling 1, as shown in FIG. 1, so they are not exposed to the emanations from the targets during EBPVD deposition.

As mentioned above, the invention advantageously proposes a predictive tool that makes it possible, at a given instant, to estimate the thickness e of the ceramic thermal barrier coating deposited by EBPVD on one of the gas turbine blades 3 mounted on the tooling 1.

In the presently described example, this tool is in the form of a computer program having instructions adapted to performing steps of an estimation method of the invention.

Figure 2:
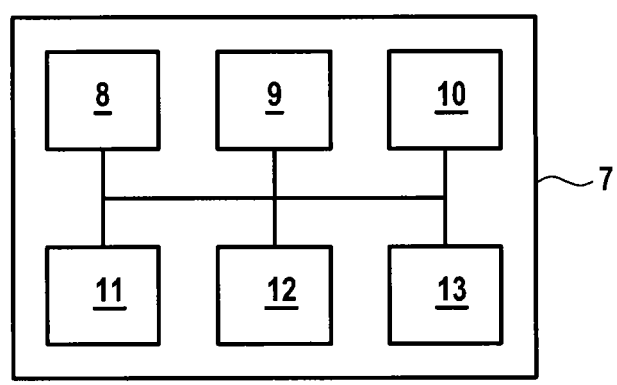
FIG. 2 shows a device in accordance with a particular embodiment of the invention and suitable for estimating the thickness of a thermal barrier coating made of ceramic that is to be deposited on a blade mounted on the tooling shown in FIG. 1.

With reference to FIG. 2, the program is stored in an estimator device 7 in accordance with the invention, and in this example having the hardware architecture of a computer.

In particular, the device 7 comprises a processor 8, a random access memory (RAM) 9, a ROM 10, a nonvolatile memory 11, input/output means 12 (e.g. a mouse, keyboard, etc.) and a screen 13 for viewing the thicknesses estimated in accordance with the invention. The ROM 10 constitutes a data medium in accordance with the invention that is readable by the processor 8 and on which the above-mentioned program is stored.

Figure 3:
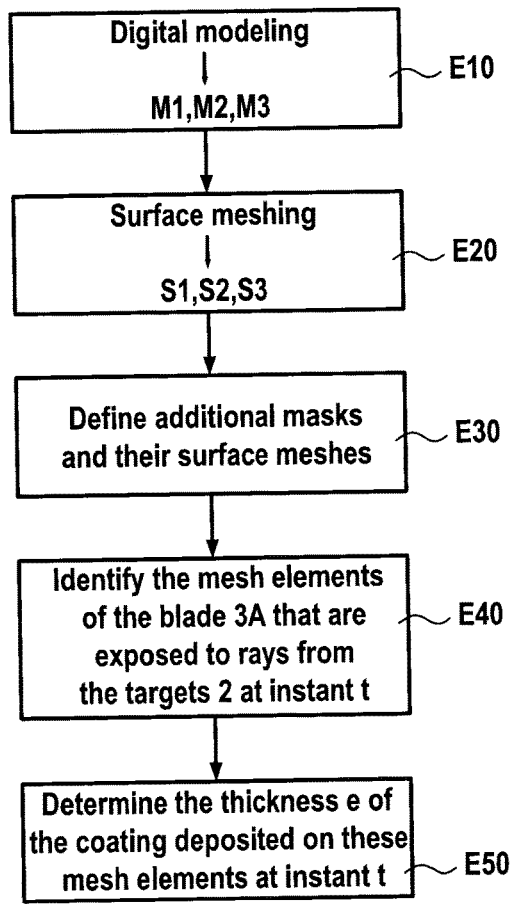
FIG. 3 is in the form of a flowchart, and shows a particular implementation of the main steps of a method in accordance with the invention for estimating the thickness of a thermal barrier coating made of ceramic, as performed by the device of FIG. 2.

With reference to FIG. 3, there follows a description of the main steps of the estimation method of the invention, in a particular implementation in which the steps are performed to estimate a thickness of ceramic coating that is to be deposited by EBPVD on one of the blades 3A of the plurality of blades 3 mounted on the tooling 1 of FIG. 1. It should be observed that the invention enables this thickness to be estimated at various points of the blade 3A.

In the presently described implementation, numerical models M1, M2, and M3 are initially established for the support tooling 1, for the targets 2, and for the blade 3A, respectively (step E10).

In this example, these digital models are in the form of discrete data files stored in the nonvolatile memory 11 of the device 7, and in particular they describe the geometrical shapes of the tooling 1, of the targets 2, and of the blade 3A, together with their positions in a predetermined reference frame (X,Y,Z). In other words, the discrete data constituting the digital models M1, M2, and M3 corresponds to the coordinates of various points representative of the tooling 1, of the targets 2, and of the blade 3A in this predetermined reference frame.

Techniques for obtaining such geometrical models are themselves known. By way of example they may be generated using computer assisted design tools such as the CATIA® tool developed by the supplier Dassault Systèmes.

In addition to defining the geometrical shapes of the elements that they model, these models also include, where appropriate, the characteristics of the movements that apply to these elements.

Thus, the model M1 includes the characteristics of the movements performed by the transverse bars 6 of the support tooling 1, namely the coordinates of the axis of revolution of the bar 6 on which the blade 3A is mounted, together with its speed of rotation about its axis.

In the presently described example, the targets 2 are stationary.

Likewise, the blade 3A is stationary relative to the transverse bar 6. In other words, the blade 3A moves relative to the targets 2 resulting solely from the movement of the transverse bar 6 on which it is mounted. Consequently, defining the movements of the transverse bar 6 is also equivalent to defining the movements of the blade 3A relative to the targets 2.

It should be observed that defining these movements makes it possible at each instant to define the position of a point on the blade 3A relative to the targets 2.

Once the models M1, M2, and M3 have been established, the surfaces of the elements as modeled in this way are represented as meshes (also referred to as tiling) (step E20).

In known manner, surface mapping a domain consists in subdividing the domain into a plurality of finite discrete geometrical elements (or cells), such as for example triangles, quadrilaterals, or other polygons. Such a mesh advantageously serves to simplify the digital models M1, M2, and M3 in order to facilitate calculating the thicknesses of the thermal barrier coating at various points on the blade 3A.

This may be done in particular with the help of known methods or software for making a mesh representation and not described in detail herein, which methods or software may be applied to the previously-established digital models M1, M2, and M3.

Figure 4A:
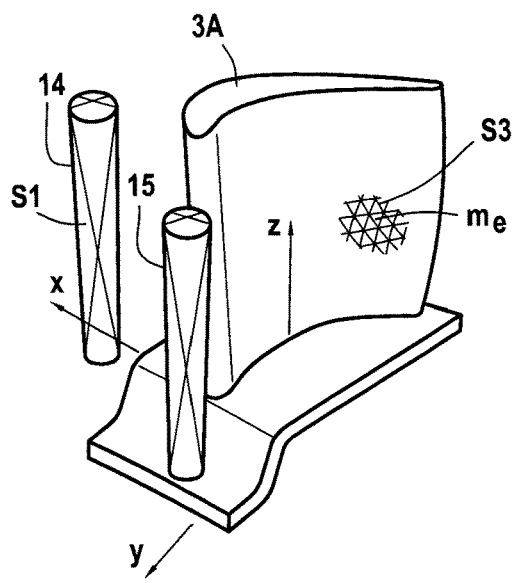
FIG. 4A shows digital models of the support tooling and of the gas turbine blade shown in FIG. 1, represented by using a surface mesh of triangles.

FIG. 4A shows an example model S3 resulting from representing the surface of the blade 3A as a mesh using triangles and starting from the digital model M3. In order to avoid overcrowding the figure, only a portion of the model S3 is shown.

Each triangle constitutes a mesh element m of the model S3. Each mesh element m of the model S3 is defined by the coordinates of its vertices A, B, and C and of its center O in the reference frame (X,Y,Z).

Figure 4B:
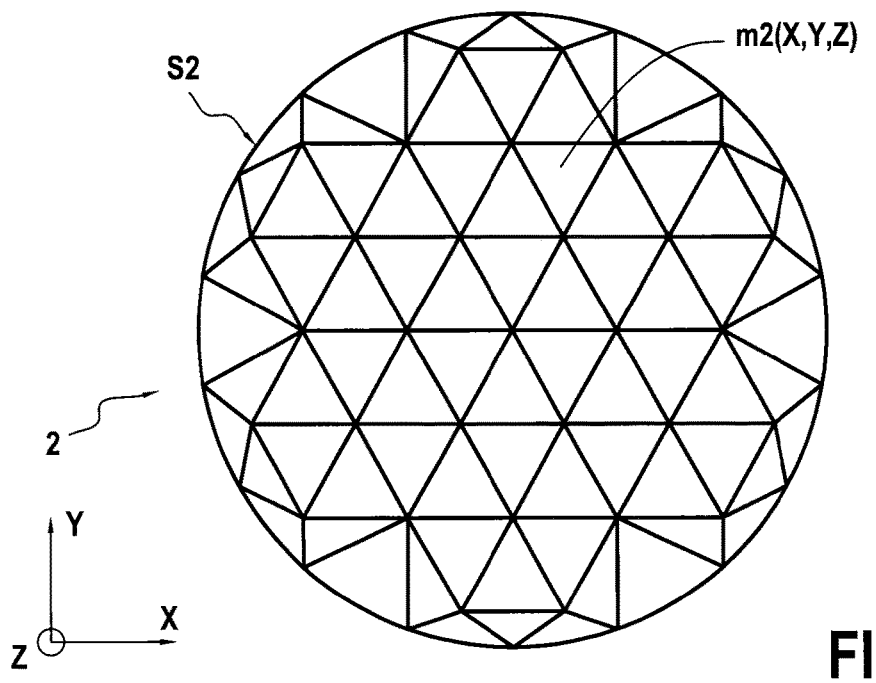
FIG. 4B shows a particular mesh for the target shown in FIG. 1.

FIG. 4B shows an example model S2 resulting from representing the surface of the target 2 as a mesh using triangles and starting from the digital model M2. Each triangle constitutes a mesh element m2 of the model S2. Each mesh element m2 of the model S2 is defined by the coordinates of its vertices A, B, and C and of its center O in the reference frame (X,Y,Z).

It should be observed that the fineness of the surface mesh representation used (i.e. the size of the cells making up the mesh) may vary from one element to the other.

Thus, it is preferable to use a surface mesh that is quite fine for the zone under study of the blade 3A and for the targets 2, in order to make it possible to estimate accurately the thickness of the coating at various points on the blade.

In contrast, it is possible to use a coarser mesh for the tooling 1, since the purpose of this mesh is to characterize rather briefly the elements of the tooling that, at a given instant, are masking zones of the blade 3A while it is being exposed to the emanations from the targets 2. These elements constitute "masks" in the meaning of the invention.

Also, the mesh representation that is used need not necessarily be uniform. Thus, the fineness of the mesh for a given element may be adapted as a function of the zones of the blade that it is desired to study.

Figure 4C:
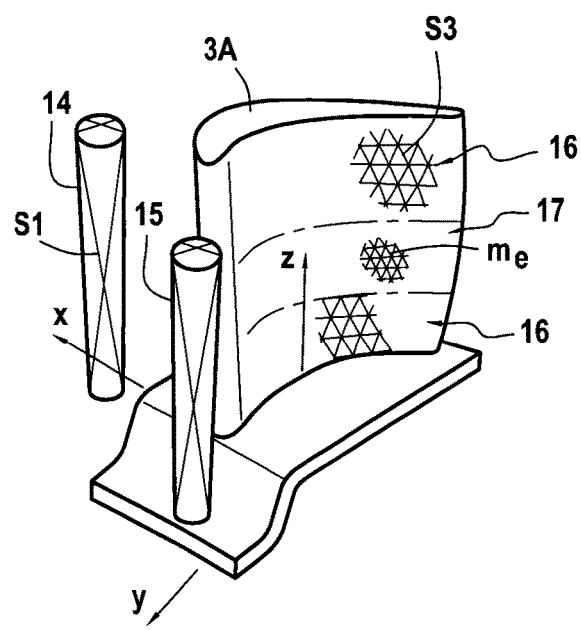
FIG. 4C shows a nonuniform mesh for the turbine blade shown in FIG. 1.

By way of example, FIG. 4C shows a nonuniform mesh S1 of the blade 3A in order to study a section at 50%, the zone of the section 17 being represented by a mesh that is much finer than for the remainder 16 of the part.

In the presently described implementation, the invention also provides the possibility of defining one or more masks (step E30) serving as screens between the targets 2 and the blade 3A during EBPVD deposition in order to prevent certain zones of the blade 3A being exposed.

These masks may be defined in two stages (digital modeling and representing the masks as surface meshes), in a manner similar to above-described steps E10 and E20.

In the example shown in FIG. 4A, two masks 14 and 15 are defined by cylinders and they are coarsely represented with the help of triangles. In a variant, other models may be envisaged, e.g. with the help of parallelepipeds.

After representing the parts 1, 2, and 3 as surface meshes on the basis of the models M1, M2, and M3 (leading to three respective mesh models S1, S2, and S3), and where appropriate, after representing the masks 14 and 15 defined in step E30 as surface meshes, those mesh elements of the blade 3A that are exposed at a given instant $\underline{t}$ to the emanations from the targets 2 are identified. In other words, the mesh elements that are identified are not masked at the instant $\underline{t}$ by an element of the support tooling 1 or by the masks 14 and 15 (step E40).

For this purpose, the processor 8 of the device 7 acts at instant $\underline{t}$ to evaluate the position of each mesh element of the blade 3A relative to the target 2 with the help of the coordinates of the centers of the mesh elements of the blade 3A and of the centers of the mesh elements of the target 2 as defined respectively in the models S1 and S2.

Then, for each mesh element m of the blade 3A and for each mesh element m2 of the targets 2, it searches to discover whether one or more mesh elements of the tooling 1 or of the masks 14 and 15 lie on the trajectory of a ray passing through the center of the mesh element m and the center of the mesh element m2. This search is based on using geometrical techniques (for identifying whether a line intersects a predetermined surface) that are themselves known and that are not described in detail herein.

In the description below, the mesh elements of the blade 3A that are exposed to emanations from the targets 2 at instant $\underline{t}$ are written $m_e$.

In the presently described implementation, for each mesh $m_e$ identified during step E40, the thickness $e(m_e)$ of the thermal barrier coating deposited by the targets 2 on that mesh at that instant is then estimated (step E50).

To do this, in accordance with the invention, the physical phenomena that take place during deposition of the thermal barrier coating are treated as radiation coming from the targets 2.

Thus, a model of radiation from the targets 2 is advantageously used for estimating the thickness $e(m_e)$. Each mesh element m2 of a target 2 is characterized by its center and it emits ceramic particles. The radiation model used herein defines the intensity of the radiation or the intensity of particle emission from each target 2 (i.e. the flow rate of particles emitted by the target) as a function of the direction of particle emission. Advantageously, this model makes it possible to take account of the position of the mesh element $m_e$ of the blade 3A under consideration relative to the target at the instant t.

Naturally, if the targets are of different natures, a different radiation model (e.g. having different parameters) may be envisaged for each target. In the presently considered example, only one radiation model is used.

More precisely, this model relies on the assumption that each mesh element m2 of a target 2 emits particles at a rate $I(\theta)$ along a direction at an angle $\theta$ relative to the normal to the mesh element m2 (and expressed as a number of particles per square meter per second), as given by the following equation (1):

$$I(\theta) = I_0 [\cos(\theta)]^n$$

where n and $I_0$ designate predetermined constants.

In other words, the rate at which particles emitted by the mesh element m2 reach a mesh element $m_e$ of the blade 3A depends on the position of the mesh element $m_e$ relative to the mesh element m2 at instant t.

The constant $I_0$ represents the mean volume of ceramic that is evaporated by the targets 2 per unit surface area. In the presently described implementation, $I_0$ is determined theoretically from the upward speed v of the ceramic (c') and from the density $\rho$ of the ceramic evaporated by the targets 2, using the following equation (2):

$$I_0 = \frac{1}{2\pi}(n+2)v\rho \frac{N_{AV}}{M_m}$$

Where $N_{AV}$ designates Avogadro's number and $M_m$ designates the molar mass of the ceramic particles emitted by the targets.

The exponent n gives the shape of the beam of particles emitted by the target 2. In this example it is determined experimentally, on the basis of tests performed using the tooling 1: the tests consist in placing test plates at various distances from the targets 2 in order to measure the rates at which particles reach the plates. The results of the tests are compared with the values given by the radiation model of equation (1), so as to adjust the value of the constant n. An average taken over all of the tests serves to deduce the value of the constant n used for modeling the target 2.

It should be observed that for simplification purposes, the radiation model described herein assumes that evaporation from a target is constant as a function of time and uniform over the entire target (i.e. over each mesh element). The inventors have observed that these assumptions are true in practice and on average over an EBPVD deposition cycle, in particular given the movements imparted to the blade 3A by the tooling 1.

Naturally, other models that are more elaborate could be envisaged in variant implementations in order to take account of variations in evaporation as a function of time and/or of evaporation being nonuniform over the target.

Starting from the radiation model defined in equation (1), the flux $\Phi_{s \to s'}$ of particles emitted by a mesh element m2 of the target 2 of surface area s towards a mesh element $m_e$ of the blade 3A of surface area s' can be written using the following equation (3):

$$\Phi_{s \to s'} = \int \int_{ss'} I_0 \cos^n \theta_1 \frac{\cos\theta_1 \cos\theta_2}{r^2} ds ds'$$

where r specifies the distance between the center of an elementary surface area ds' of the mesh element $m_e$ from the center of an elementary surface area ds of the mesh element m2, $\theta_1$ designates the angle at which the elementary surface area ds of the mesh element m2 emits a ray relative to the normal to the elementary surface area ds of the mesh element m2, and $\theta_2$ designates the angle at which the elementary surface area ds' of the mesh element $m_e$ receives the same ray relative to the normal to the elementary surface area ds' of the mesh element $m_e$.

Figure 5:
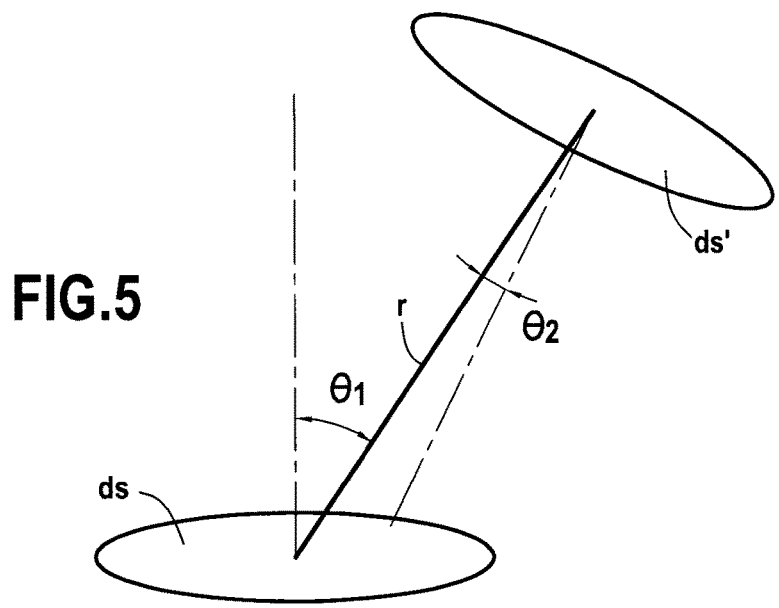
FIG. 5 shows a ray emitted by a mesh element of the target towards a mesh element of the turbine blade.

FIG. 5 shows the distance r, and the emission and the reception angles $\theta_1$ and $\theta_2$.

With a fine mesh for the targets 2 and for the blade 3A, s and s' are small compared with the distance r, such that equation (3) can be approximated by the following equation (4):

$$\Phi_{s \to s'} = I_0 \cos^n \theta_1 \frac{\cos\theta_1 \cos\theta_2}{r^2} ss'$$

where r specifies the distance between the center of the mesh element $m_e$ from the center of the mesh element m2, $\theta_1$ designates the angle at which the mesh element m2 emits a ray relative to the normal to the mesh element m2, and $\theta_2$ designates the angle at which the mesh element $m_e$ receives the same ray relative to the normal to the mesh element $m_e$.

Since the total flux $\Phi_{s'}$ of particles radiated by the target 2 to the surface area s' of the mesh $m_e$ is equal to the sum of all of the contributions from the surface areas s of the meshes m2 of the target on the surface area s', the following equation (5) applies:

$$\Phi_{s'} = \sum_s \Phi_{s \to s'}$$

The processor 8 thus evaluates the total flux $\Phi_{s'}$ of particles radiated by the target 2 from equations (4) and (5). For this purpose, the angles $\theta_1$ and $\theta_2$ and the distance r are calculated by the processor 8 in known manner from the coordinates of the centers of the mesh elements m2 and $m_e$ as defined by the mesh models S2 and S3. The dimensions of the surface areas s and s' are predefined and known from the surface meshing step E20.

On the basis of the total flux $\Phi_{s'}$ as evaluated in this way, the processor 8 calculates the mass $M_{deposit}$ that is deposited at instant t (i.e. after an exposure of duration t to the radiation from the targets) on the surface area s' of the mesh element $m_e$ under consideration by using the following equation (6):

$$M_{deposit} = \Phi_{s'} t \frac{M_m}{N_{AV}}$$

Thereafter it evaluates the thickness $e(m_e)$ of the coating deposited at the instant t on the mesh element $m_e$ of surface area s' with the help of following equation (7):

$$e(m_e) = \frac{M_{deposit}}{\rho s'}$$

In the presently described implementation, during the estimation step E50, the processor 8 also applies a multiplicative loss factor γ to the thickness $e(m_e)$ representing rays that are emitted by the targets 2 but that do not reach the blade 3A, including when there are no masks impeding the passage of these rays (these rays are models of ceramic particles emitted by the targets but that do not reach the blade 3A). This factor γ varies as a function of the distance traveled by the ray, and therefore as a function of the position of the blade 3A relative to the target. It may be determined experimentally by performing tests on real parts, in a manner similar to determining the exponent n.

At the end of step E50, the thickness estimated by the processor 8 for the mesh element $m_e$ of the blade 3A at instant t is given by $\gamma \times e(m_e)$. This thickness represents the thickness of the ceramic thermal barrier coating that is to be deposited by the targets 2 on the mesh element $m_e$ of the blade 3A at instant t.

Figure 6:
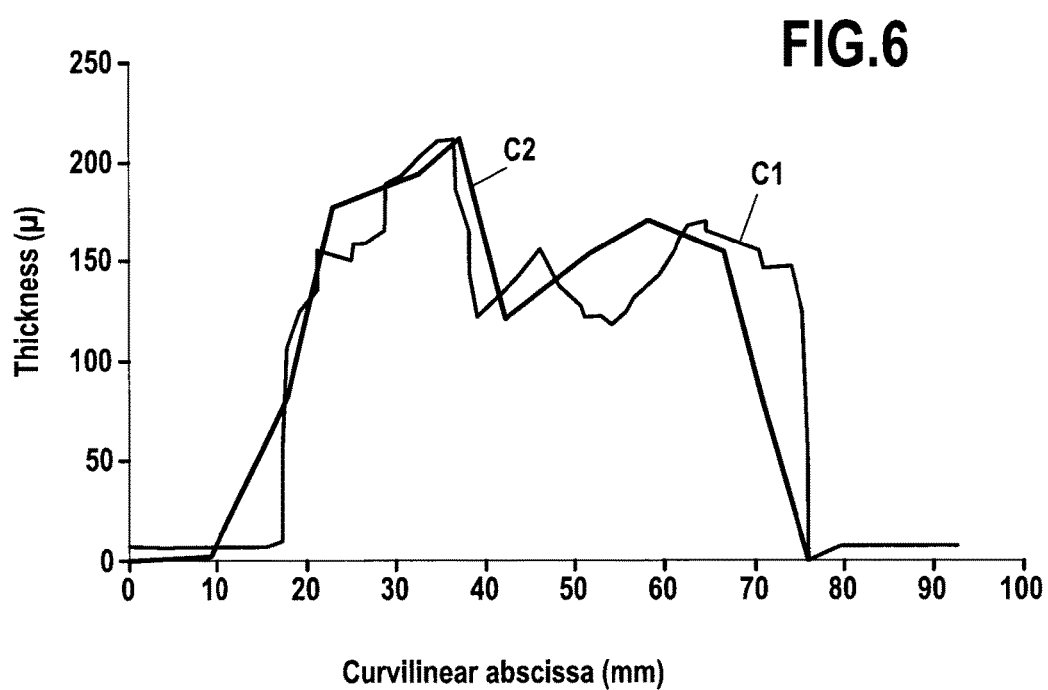
FIG. 6 shows thickness values for the thermal barrier coating made of ceramic as obtained using the method of the invention and compared with test results.

For a given section of a blade (e.g. section at 50%), FIG. 6 shows thermal barrier coating thickness values as estimated with the help of the method of the invention for various different curvilinear abscissa values. These values are represented by curve C1. In the example shown, n=3.5 and γ=0.667 (deduced from testing).

By way of comparison, this figure also shows a curve C2 of thickness values obtained by real tests. It should be observed that the curve C1 is very close to the curve C2. The differences observed between the two curves may be explained in particular by the number of points taken into consideration for constructing the curve C2 being less than the number of points that were estimated with the help of the method of the invention for the curve C1. The digital tool proposed by the invention thus makes it possible quickly and simply to estimate the coating thickness at many more points than can be measured during tests on a real part.

The invention thus makes it possible to obtain easily and quickly the thickness of the ceramic thermal barrier coating that is to be deposited at any point on a hot part of a gas turbine, such as the blade 3A, taking predetermined technical constraints into consideration. These constraints (e.g. the shape and the movements of the tooling, the presence of masks, etc.) can easily be specified, e.g. by means of a man machine interface (MMI) constituting an interface with the digital tool of the invention.

Similarly, it is possible to develop an MMI for facilitating viewing and using the results (thermal barrier coating thickness). For example, such an MMI could show the variation in the thickness of the thermal barrier coating at various points on the hot part as a function of time, with the distribution of such thicknesses on different sections of the hot part, or indeed with the distribution of thicknesses over the entire hot part, etc.

The invention claimed is:

1. An estimation method for estimating thickness of a ceramic thermal barrier coating that is to be deposited by physical vapor deposition from at least one target and onto a gas turbine hot part mounted on support tooling, the method comprising:
   digitally modeling, by a processor, a geometrical shape of the hot part and movements of the hot part relative to the at least one target;
   representing, by the processor, the hot part as digitally modeled as a surface mesh;
   digitally modeling, by the processor, a geometrical shape of the at least one target;
   representing, by the processor, the at least one target as digitally modeled as a surface mesh;
   digitally modeling, by the processor, a geometrical shape and a movement of the support tooling for supporting the hot part;
   representing, by the processor, the support tooling as digitally modeled as a surface mesh; and
   estimating, by the processor, for at least one mesh element of the hot part exposed to radiation from the at least one target during deposition of the coating, a coating thickness to be deposited on the at least one mesh element of the hot part at a given instant by using a radiation model modeling radiation from the at least one target and taking account of a position of the at least one mesh element of the hot part at that given instant relative to the at least one target, the radiation model being defined for a mesh element of the at least one target by:

$$I(\theta)=I_0[\cos(\theta)]^n$$

wherein:
$I(\theta)$ designates intensity of a ray emitted by the mesh element of the at least one target in a direction at an angle θ relative to the normal to the mesh element of the at least one target; and
n and $I_0$ designate predetermined constants.

2. The method according to claim 1, further comprising:
digitally modeling at least one mask configured to prevent a zone of the hot part being exposed to the radiation from the at least one target; and
representing the at least one mask as a surface mesh; and
wherein the mesh elements of the hot part that are taken into consideration during the estimating comprise mesh elements that are not masked at the given instant from the at least one target by mesh elements of the at least one mask during deposition of the coating.

3. The method according to claim 2, wherein the at least one mask comes from an element of the support tooling for supporting the hot part.

4. The method according to claim 3, wherein fineness of the surface mesh varies between at least two among the hot part, the target, the mask, and the support tooling.

5. The method according to claim 1, wherein during the estimating, account is also taken of a loss factor corresponding to rays that are emitted by the at least one target during deposition but that do not reach the hot part.

6. The method according to claim 1, wherein during the surface meshing the modeled hot part, the part is subjected to nonuniform surface meshing.

7. A non-transitory computer-readable data medium storing a computer program including instructions for executing the estimation method according to claim 1.

8. The method according to claim 1, wherein the hot part is a rotor blade of a gas turbine.

9. The method according to claim 1, wherein the hot part is a stator blade of a gas turbine.

10. A device for estimating thickness of a ceramic thermal barrier coating that is to be deposited by physical vapor deposition from at least one target and onto a gas turbine hot part mounted on support tooling, the device comprising:
    a processor configured to:
        digitally model a geometrical shape of the hot part and movements of the hot part relative to the at least one target;

represent the hot part as digitally modeled as a surface mesh;

digitally model a geometrical shape of the at least one target;

represent the at least one target as digitally modeled as a surface mesh;

digitally model a geometrical shape and a movement of the support tooling for supporting the hot part;

represent the support tooling as digitally modeled as a surface mesh; and estimate, for at least one mesh element of the hot part exposed to the radiation from the at least one target during deposition of the coating, a coating thickness to be deposited on the at least one mesh element of the hot part at a given instant by using a radiation model modeling radiation from the at least one target and taking account of a position of the at least one mesh element of the hot part at that given instant relative to the at least one target, the radiation model being defined for a mesh element of the at least one target by:

$$I(\theta)=I_0[\cos(\theta)]^n$$

wherein:

$I(\theta)$ designates intensity of a ray emitted by the mesh element of the at least one target in a direction at an angle $\theta$ relative to the normal to the mesh element of the at least one target; and $n$ and $I_0$ designate predetermined constants.

11. An estimation method for estimating thickness of a ceramic thermal barrier coating that is to be deposited by physical vapor deposition from at least one target and onto a gas turbine hot part mounted on support tooling, the method comprising:

digitally modeling, by a processor, a geometrical shape of the hot part and movements of the hot part relative to the at least one target;

representing, by the processor, the hot part as digitally modeled as a surface mesh;

digitally modeling, by the processor, a geometrical shape of the at least one target;

representing, by the processor, the at least one target as digitally modeled as a surface mesh;

digitally modeling, by the processor, at least one mask suitable for preventing a zone of the hot part being exposed to radiation from the at least one target at a given instant;

representing, by the processor, the at least one mask as digitally modeled as a surface mesh, wherein fineness of the surface mesh varies between at least two among the hot part, the target, and the at least one mask; and estimating, by the processor, for at least one mesh element of the hot part exposed to radiation from the at least one target during deposition of the coating, a coating thickness to be deposited on the at least one mesh element of the hot part at the given instant by using a radiation model modeling radiation from the at least one target and taking account of a position of the at least one mesh element of the hot part at that given instant relative to the at least one target, the radiation model being defined for a mesh element of the at least one target by:

$$I(\theta)=I_0[\cos(\theta)]^n$$

wherein:

$I(\theta)$ designates intensity of a ray emitted by the mesh element of the at least one target in a direction at an angle $\theta$ relative to the normal to the mesh element of the at least one target; and $n$ and $I_0$ designate predetermined constants.

12. The method according to claim 11, wherein the mesh elements of the hot part that are taken into consideration during the estimating comprise mesh elements that are not masked at the given instant from the at least one target by mesh elements of the at least one mask during deposition of the coating.

13. The method according to claim 11, wherein the at least one mask comes from an element of the support tooling for supporting the hot part.

14. The method according to claim 11, wherein during the estimating, account is also taken of a loss factor corresponding to rays that are emitted by the at least one target during deposition but that do not reach the hot part.

15. The method according to claim 11, wherein during the surface meshing the modeled hot part, the part is subjected to nonuniform surface meshing.

16. A non-transitory computer-readable data medium storing a computer program including instructions for executing the estimation method according to claim 11.

17. The method according to claim 11, wherein the hot part is a rotor blade of a gas turbine.

18. The method according to claim 11, wherein the hot part is a stator blade of a gas turbine.

19. The method according to claim 11, further comprising:

digitally modeling, by the processor, a geometrical shape and a movement of the support tooling for supporting the hot part; and representing, by the processor, the support tooling as digitally modeled as a surface mesh.

20. A device for estimating thickness of a ceramic thermal barrier coating that is to be deposited by physical vapor deposition from at least one target and onto a gas turbine hot part mounted on support tooling, the device comprising:

a processor configured to:

digitally model a geometrical shape of the hot part and movements of the hot part relative to the at least one target;

represent the hot part as digitally modeled as a surface mesh;

digitally model a geometrical shape of the at least one target;

represent the at least one target as digitally modeled as a surface mesh;

digitally model at least one mask suitable for preventing a zone of the hot part being exposed to radiation from the at least one target at a given instant;

represent the at least one mask as digitally modeled as a surface mesh, wherein fineness of the surface mesh varies between at least two among the hot part, the target, and the at least one mask; and estimate, for at least one mesh element of the hot part exposed to the radiation from the at least one target during deposition of the coating, a coating thickness to be deposited on the at least one mesh element of the hot part at the given instant by using a radiation model modeling radiation from the at least one target and taking account of a position of the at least one mesh element of the hot part at that given instant relative to the at least one target, the radiation model being defined for a mesh element of the at least one target by:

$$I(\theta)=I_0[\cos(\theta)]^n$$

wherein:
I(θ) designates intensity of a ray emitted by the mesh element of the at least one target in a direction at an angle θ relative to the normal to the mesh element of the at least one target; and
n and $I_0$ designate predetermined constants.

* * * * *